United States Patent [19]

Nakamura et al.

[11] E Patent Number: Re. 32,132

[45] Reissued Date of Patent: Apr. 29, 1986

[54] VIDEO SIGNAL PLAY-BACK CIRCUIT

[75] Inventors: Hisashi Nakamura, Tokyo; Toshiyuki Akiyama, Kokubunji; Akira Shibata, Yokosuka; Yoichi Tokunaga, Mito, all of Japan

[73] Assignee: Hitachi, Ltd., Tokyo, Japan

[21] Appl. No.: 394,640

[22] Filed: Jul. 1, 1982

Related U.S. Patent Documents

Reissue of:

[64] Patent No.: 4,210,942
Issued: Jul. 1, 1980
Appl. No.: 883,155
Filed: Mar. 3, 1978

[30] Foreign Application Priority Data

Mar. 11, 1977 [JP] Japan ..... 52-25943

[51] Int. Cl.[4] ..... G11B 5/45; G11B 5/02; H03F 1/34

[52] U.S. Cl. ..... 360/65; 330/107; 330/149; 330/277; 330/294; 330/300; 360/67

[58] Field of Search ..... 330/107, 109, 149, 277, 330/291, 294; 360/65, 67

[56] References Cited

U.S. PATENT DOCUMENTS

| | | | |
|---|---|---|---|
| 2,828,368 | 3/1958 | Wiegand | 360/67 |
| 3,007,010 | 10/1961 | Erath et al. | 360/65 |
| 3,026,380 | 3/1962 | Reher et al. | 360/67 |
| 3,068,327 | 12/1962 | Davidson | 360/67 |
| 3,310,637 | 3/1967 | Skov | 360/65 |
| 4,041,538 | 8/1977 | Parker | 360/67 |
| 4,093,965 | 6/1978 | Gish | 360/65 |
| 4,134,140 | 1/1979 | Wright et al. | 360/65 X |

OTHER PUBLICATIONS

Faulkenberry, *An Introduction to Operational Amplifiers with Linear IC Applications*, John Wiley & Sons, Copyright 1977, 1982, pp. 409, 410.

*Primary Examiner*—James B. Mullins
*Attorney, Agent, or Firm*—Antonelli, Terry & Wands

[57] ABSTRACT

In a video signal play-back circuit connected so that a play-back signal from a magnetic head may be applied to an amplifier circuit through a resonance circuit which consists of an inductance element and a capacitance element, a resistor for adjusting the quality factor Q of the resonance circuit is connected between one terminal of the resonance circuit and one output terminal of the amplifier circuit, thereby to reduce thermal noises which develop from the Q adjusting resistor.

14 Claims, 3 Drawing Figures

VIDEO SIGNAL PLAY-BACK CIRCUIT

Matter enclosed in heavy brackets [ ] appears in the original patent but forms no part of this reissue specification; matter printed in italics indicates the additions made by reissue.

BACKGROUND OF THE INVENTION

This invention relates to a circuit which plays back a video signal recorded on a magnetic recording medium such as magnetic tape and magnetic disk. More particularly, it relates to an equalizer circuit which bestows the compensation of a frequency characteristic on a signal played back by a magnetic head.

In magnetic recording and play-back apparatus such as video tape recorders (VTR) wherein a video signal is recorded on a magnetic recording medium and played back therefrom, the video signal is generally subjected to frequency modulation and recorded as a frequency-modulated signal. The frequency-modulated signal has the frequency characteristic degraded in the processes of recording and play-back with the magnetic recording medium and a magnetic head. Specifically, the level of a lower frequency region below the carrier frequency of the frequency modulation rises, and the lower sideband component of the frequency-modulated signal is emphasized.

When the frequency-modulated signal having undergone such a degradation is demodulated as it is, the level becomes higher in a higher frequency region of the demodulated signal. In an extreme case, a phenomenon called inversion in which the original signal can no longer be played back takes place. The inversion is attributed to the fact that the level of the lower sideband wave becomes higher than the level of the carrier wave. In the play-back, a very unsightly picture frame expressed as the burst of a picture frame is reproduced.

Apart from the above, the so-called modulation noise which the magnetic recording medium has adds to the noise of the frequency-modulated signal in the processes of magnetic recording and play-back, so that the signal-to-noise ratio of the demodulated signal is degraded.

In the conventional magnetic recording and playback apparatus, an equalizer circuit is usually provided which compensates for such degradations occurring in the processes of recording and play-back, for the purposes of flattening the frequency characteristic of the demodulated signal, preventing inversion, and enhancing the signal-to-noise ratio.

It is considered that the processes of magnetic recording and play-back involve no change in the phase characteristic even if they involve a change in the amplitude characteristic. As the equalizer circuit, therefore, a circuit needs to be employed which uses a delay circuit, the phase characteristic of which is flat and only the amplitude characteristic of which varies. Such an equalizer circuit is adopted in a VTR for broadcast.

The equalizer circuit using the delay circuit, however, has a complicated arrangement and becomes expensive. Accordingly, in VTR's for industrial use, domestic use etc. for which importance is attached to the simplification of the arrangement, it is common practice to ignore some change in the phase characteristic and to adopt an equalizer circuit of simple arrangement employing a resonance circuit.

In case of employing the resonance circuit, a thermal noise develops from a resistor which is connected in order to adjust the quality factor Q of the resonance circuit. The thermal noise is quite small in comparison with the noises which are generated in the processes of magnetic recording and play-back. In general, noises which arise in the whole play-back circuit including the resonance circuit are about 10 dB lower than the noises which arise in the processes of magnetic recording and play-back. The noises of the play-back circuit are usually negligible.

On the other hand, in order to raise the practicability of the industrial and domestic VTR's, the reduction of the quantity of consumption of a magnetic tape has recently been endeavored by diminishing the width of a track on the magnetic tape, and therewith, shortening the recording wavelength on the tape as is formed by a signal to be recorded. The shortening of the recording wavelength lowers the relative velocity of a tape head, decreases the diameter of a rotary cylinder for rotating the magnetic head, and is effective to miniaturize the apparatus.

The diminution of the track width and the shortening of the recording wavelength enhance the recording density, which inevitably lowers the output signal of the magnetic head. In an example wherein the track width of approximately 100 μm in a prior art system is diminished to 30–60 μm and wherein the recording wavelength of approximately 2 μm is shortened to approximately 1.5 μm, the output signal of the play-back head lowers $\frac{1}{2}$–$\frac{1}{3}$. As a result, the magnitude of the noises generated in the processes of recording and play-back and the magnitude of the noises of the play-back circuit become roughly equal, and the noises of the play-back circuit, especially the thermal noise from the resistor in the resonance circuit employed as the equalizer circuit, cannot be ignored.

SUMMARY OF THE INVENTION

An object of this invention is to provide a video signal play-back circuit in which the thermal noise developing from the resistor connected for adjusting the quality factor Q of the resonance circuit is reduced.

In order to accomplish the object, this invention consists in a circuit wherein an amplifier and a resonance circuit comprising an inductance element and a capacitance element are connected, characterized in that the resistor for adjusting Q is inserted between an output terminal of the amplifier and one terminal of the resonance circuit.

The other objects and features of the present invention will become apparent from the following detailed description when read in conjunction with the accompanying drawings.

DETAILED DESCRIPTION OF THE PREFERRED EMBODIMENT

Figure 1:
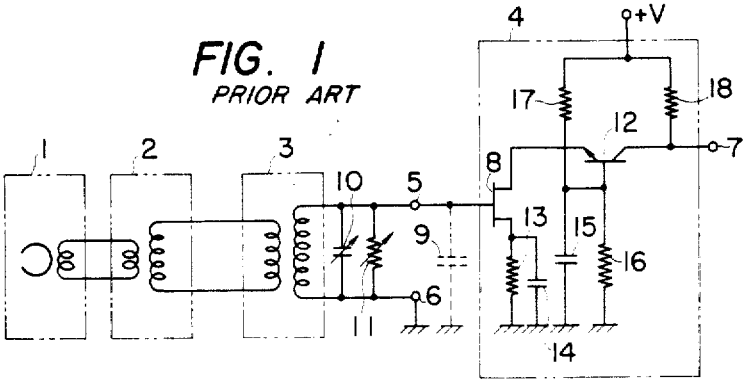
FIG. 1 PRIOR ART
FIG. 1 is a connection diagram of a typical prior art play-back circuit.

In order to facilitate understanding of this invention, a typical prior art play-back circuit will first be described with reference to FIG. 1.

In the figure, numeral 1 designates a magnetic head, numeral 2 a rotary transformer for deriving a signal from the rotating magnetic head, numeral 3 a boosting transformer for boosting a signal voltage, and numeral 4 an amplifier circuit. These components are connected in cascade and make up a play-back amplifier and equalizer circuit (hereinbelow, termed the play-back circuit). The signal from the magnetic head 1 is led to input terminals 5 and 6 of the amplifier circuit 4 through the rotary transformer 2 as well as the boosting transformer 3. The amplifier circuit 4 takes the form of a cascode amplifier in order to prevent input capacitance from increasing due to the Miller effect. A play-back circuit output is obtained at an output terminal 7 of this amplifier circuit.

As the inductance of the resonance circuit, that which is present at the terminals 5 and 6 mainly by the inductance of the magnetic head 1 may be used. The capacitance of the resonance circuit is made up of a stray capacity 9 which includes the input capacity of a transistor 8, the capacity of wirings, the capacity of the magnetic head, etc., and a capacitor 10 which serves to adjust the resonance frequency. Further, it is necessary to bring the characteristic of the resonance circuit near to a predetermined equalization characteristic. To this end, a resistor 11 is connected, and the quality factor Q of the resonance circuit is set by adjusting the resistance value thereof. In many actual examples, the resonance frequency is set between 4 MHz and 5 MHz, and the value of Q between 2 and 4.

The amplifier circuit 4 is the basic cascode amplifier circuit generally and extensively employed, and includes transistors 8 and 12, a biasing source resistor 13, high frequency by-pass capacitors 14 and 15, resistors 16 and 17 for applying d.c. voltages, and a load resistor 18.

Figure 2:
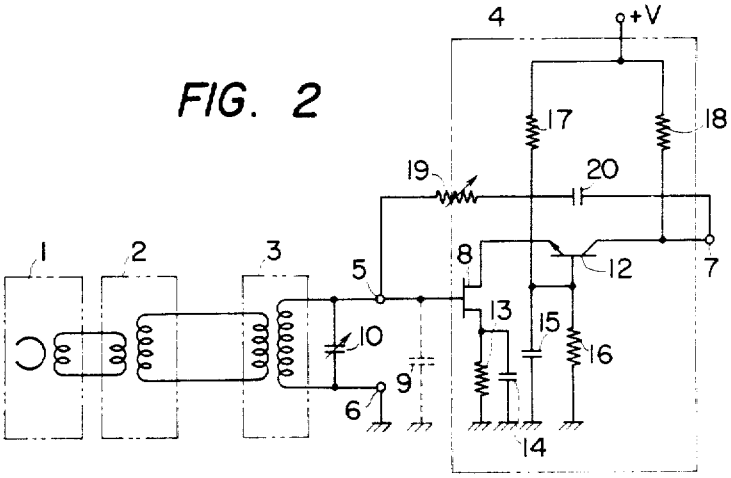
FIG. 2 is a connection diagram of a play-back circuit according to this invention.

This invention reduces the thermal noise of the resistor 11 in the circuit of FIG. 1, and an embodiment thereof is shown in FIG. 2. In FIG. 2, the same constituents as in FIG. 1 are assigned the same reference numerals, which are not repeatedly explained.

As previously stated, the play-back circuit of this invention is characterized in that a resistor 19 for adjusting the quality factor Q of the resonance circuit is connected between a terminal of the resonance circuit (the input terminal 5 of the amplifier circuit) and the output terminal 7 of the amplifier circuit. A capacitor 20 serves to cut off direct current. This capacitor can be dispensed with in some arrangements of the amplifier circuit.

In this case, the gain of the amplifier circuit is made sufficient, and the resistance of the resistor 19 is set to be higher than the resistance of the resistor 11 in the circuit of FIG. 1.

The reason for such a setting is that a negative feedback circuit is formed of the resonance circuit and the amplifier circuit through the resistor 19. By exploiting the effect of this negative feedback, an apparent resistor can be connected between the terminals 5 and 6 as in the circuit of FIG. 1. Specifically, the resistance of the resistor connected anew is set to be greater than the resistance of the resistor in the circuit of FIG. 1 approximately to the amount of the negative feedback.

Owing to the above connection, the signal-to-noise ratio is improved as explained below. When a field-effect transistor is adopted as the transistor 8 of the amplifier circuit 4, the noise of the transistor is occupied by the thermal noise of the drain—source resistance on the output terminal side of the transistor, and it seems that no noise exists on the gate side being the input terminal. Therefore, the signal-to-noise ratio is improved by the effect of the negative feedback. Further, the signal-to-noise ratio at the terminal of the resonance circuit at the time when the negative feedback is applied may be considered identical to the signal-to-noise ratio at the time when the negative feedback is not formed by rendering the mutual conductance of the transistor zero. In this case, the signal-to-noise ratio is improved as compared with that of the circuit in FIG. 1, by the magnitude of the square root of the ratio of the value of the resistor connected anew with respect to the value of the resistor in the circuit of FIG. 1. This is because, concurrently with the increase of the resistance of the resistor, the level of the signal rises at the same ratio, while the voltage of the thermal noise which the resistor generates rises according to the square root of the ratio.

The signal-to-noise ratio (S/N) of the play-back circuit according to this invention will now be more concretely compared with the signal-to-noise ratio ($S_0/N_0$) of the circuit of FIG. 1.

The resistance of the Q adjusting resistor 11 in the circuit of FIG. 1 is set to be $R_0$, and the resistance of the Q adjusting resistor (the apparent resistor between the terminals 5 and 6 as formed by the negative feedback) in the circuit of this invention is assumed to become $R_1$. The thermal noises which develop in the respective resistors are $\sqrt{K R_0}$ and $\sqrt{K R_1}$ (where K denotes a constant).

Putting $R_1/R_0=G$ (where $G>1$), the quality factor Q of the resonance circuit of this invention becomes G times the quality factor Q of the circuit of FIG. 1, and hence, also the signal S is G times, that is, $S=G S_o$. On the other hand, regarding the noise N, $$\frac{\sqrt{K R_1}}{\sqrt{K R_0}} = \sqrt{G}$$

so that $$N=\sqrt{G} N_0$$

Accordingly, the signal-to-noise ratio of the circuit of this invention becomes:

$$S/N = \frac{G S_o}{\sqrt{G} N_o} = \sqrt{G} \cdot S_o/N_o$$

This is improved to $\sqrt{G}$ times the signal-to-noise ratio, $S_0/N_0$ of the circuit in FIG. 1.

As specific data, the inductance of the magnetic head 1 is made 1.5 μH, the boosting ratio of the rotary transformer 2 is made 2, the boosting ratio of the boosting transformer 3 is made 2.5, and the resonance frequency and the quality factor Q of the resonance circuit are respectively selected to be 4.4 MHz and 3. At this time, the resistance (e.g., 120 kΩ) of the resistor 19 is set sufficiently higher than the resistance (e.g. 8 kΩ) of the resistor 11 in the circuit of FIG. 1 in order to obtain the same resonance characteristic. As a result, the impedance of the gate terminal of the transistor 8 rises, and the signal voltage rises, so that the signal-to-noise ratio is enhanced.

Figure 3:
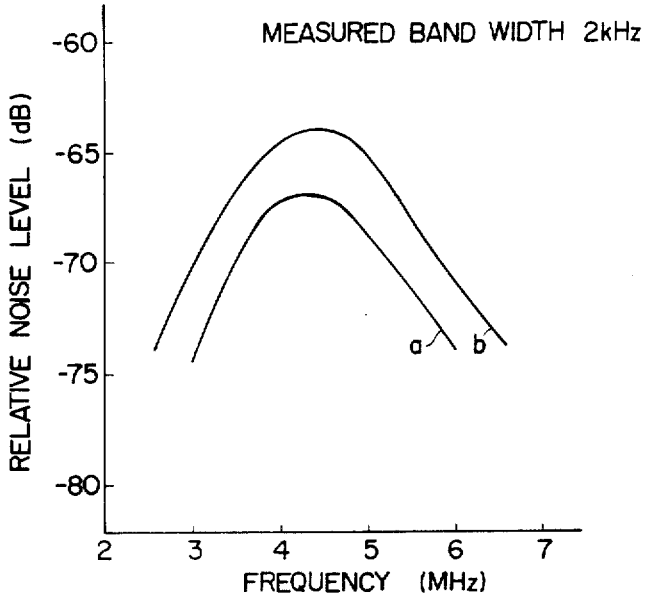
FIG. 3 is a graph showing in comparison the measured results of noises in the circuits of FIGS. 1 and 2.
Figure 4:
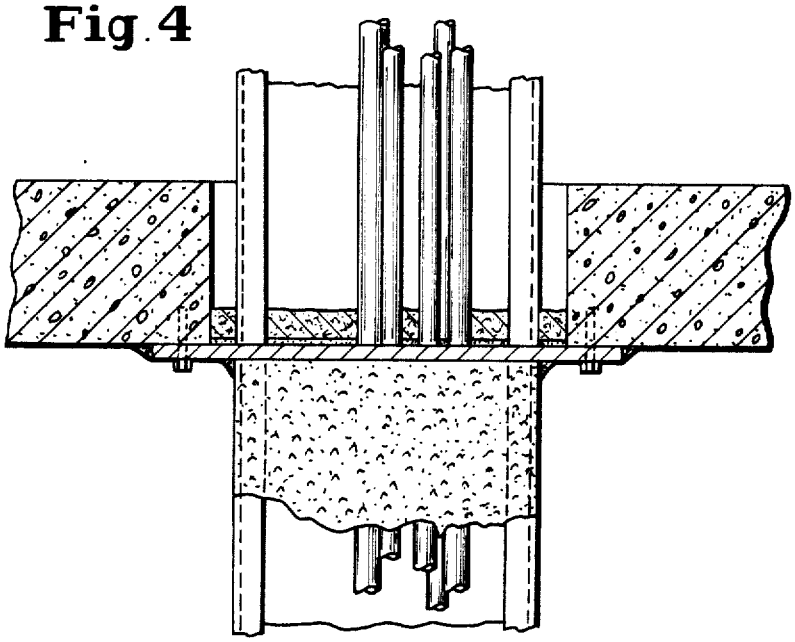
Figure 5:
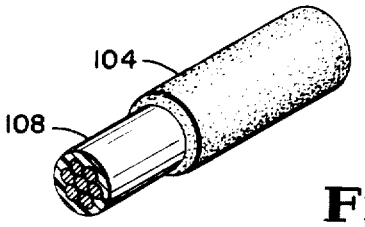
Figure 6:
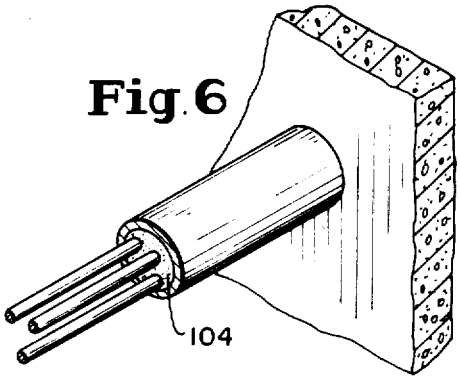
Figure 9:
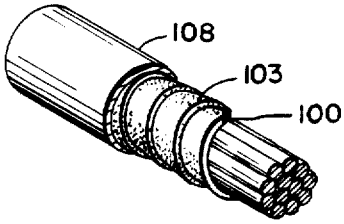
Figure 7:
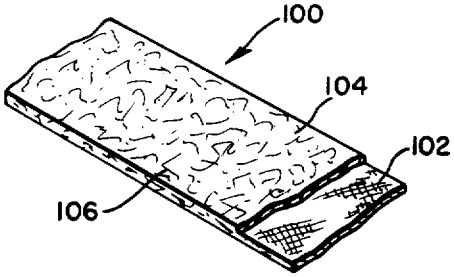
Figure 8:
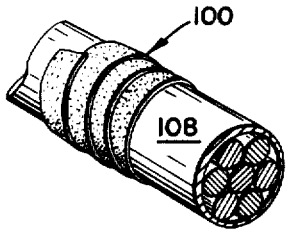

FIG. 3 shows the actually measured values of the noise levels of the circuit of the embodiment in FIG. 2 and the known circuit in FIG. 1. A curve a indicates the noise of the present invention embodiment, and a curve b the noise of the known circuit. It is understood that the noise could be reduced about 3 dB by the circuit of the embodiment.

In the above description, the construction of the magnetic head portion has been exemplified as the rotary head type employing the rotary transformer. Besides the example, there are various constructions including one employing a slip ring instead of the rotary transformer, one of the fixed head type, etc. Needless to say, in any of these cases, the equalizer circuit employing the resonance circuit can be similarly formed, and this invention is applicable.

I claim:

1. A video signal play-back circuit comprising:

a magnetic head which detects a video signal recorded on a magnetic recording medium;

a resonance circuit which is electrically connected to said magnetic head so that the signal picked up by said magnetic head may be applied to said resonance circuit, and which includes an inductance element and a capacitance element including a variable capacitor for adjusting the resonance frequency of the resonance circuit for equalization of the frequency characteristic of the signal play-back circuit;

an amplifier circuit having a field-effect transistor of which the gate terminal is connected with said resonance circuit to provide a high input impedance to said amplifier circuit; and

*means for adjusting a quality factor Q of said resonance circuit without any substantial increase in thermal noise of said resonance circuit, said means comprising* a variable resistor which is connected between one output terminal of said amplifier circuit and one terminal of said resonance circuit and which [serves to adjust a quality factor Q of said resonance circuit] *has a value of resistance which sets the quality factor Q of said resonance circuit at a value between 2 and 4.*

2. A signal play-back circuit according to claim 1, wherein a capacitor for cutting off direct current is connected in series with the Q adjusting resistor.

3. A signal play-back circuit according to claim 1, wherein an inductance which said magnetic head has is included as said inductance element of said resonance circuit.

4. A signal play-back circuit according to claim 1, wherein the Q adjusting resistor has a resistance value $R_1$ which is greater than a resistance value $R_0$ in the case where it is connected across said one terminal of said resonance circuit and a reference terminal in order to attain the same resonance characteristic.

5. A signal play-back signal according to claim 1 or 7, wherein the Q adjusting resistor has a resistance value $R_1$ which is greater than an apparent resistance value $R_0$ between said one terminal of said resonance circuit and a reference terminal when said Q adjusting resistor is coupled in the circuit in order to attain the same resonance characteristic as if a physical resistor $R_0$ were coupled between said one terminal of the resonance circuit and said reference terminal.

6. A signal play-back circuit according to claim 5, wherein said reference terminal is coupled to ground.

7. A video signal play-back circuit comprising:

a rotating magnetic head which detects a video signal recorded on a magnetic recording medium;

a rotary transformer which derives a signal from the rotating magnetic head;

a boosting transformer which boosts a signal from said rotary transformer;

a resonance circuit which is electrically connected to said boosting transformer in order to improve a frequency characteristic of an output signal of said boosting transformer and which includes an inductance element and a capacitance element including a variable capacitor for adjusting the resonance frequency of the resonance circuit for equalization of the frequency characteristic of the signal play-back circuit;

an amplifier circuit having a field-effect transistor of which the gate terminal is connected with said resonance circuit to provide a high input impedance to said amplifier circuit; and

*means for adjusting a quality factor Q of said resonance circuit without any substantial increase in thermal noise of said resonance circuit, said means comprising* a variable resistor which is connected between one output terminal of said amplifier circuit and one terminal of said resonance circuit and which [serves to adjust a quality factor Q of said resonance circuit] *has a value of resistance which sets the quality factor Q of said resonance circuit at a value between 2 and 4.*

8. A video signal play-back circuit comprising:

a rotating magnetic head which detects a video signal recorded on a magnetic recording medium;

a rotary transformer which derives a signal from the rotating magnetic head;

a boosting transformer coupled to a secondary coil of said rotary transformer to boost a signal from said rotary transformer;

a resonance circuit which is electrically connected to said boosting transformer in order to improve a frequency characteristic of an output signal of said boosting transformer, and which includes an inductance element and a capacitance element including a variable capacitor coupled across a secondary coil of said boosting transformer for adjusting the resonance frequency of the resonance circuit for equalization of the frequency characteristic of the signal play-back circuit;

an amplifier circuit having a field-effect transistor of which the gate terminal is connected with said resonance circuit to provide a high input impedance to said amplifier circuit; and

*means for adjusting a quality factor Q of said resonance circuit without any substantial increase in thermal noise of said resonance circuit, said means comprising* a variable resistor which is connected between one output terminal of said amplifier circuit and one terminal of said resonance circuit and which [serves to adjust a quality factor Q of said resonance circuit] *has a value of resistance which sets the quality factor Q of said resonance circuit at a value between 2 and 4,* wherein the Q adjusting resistor has a resistance value $R_1$ which is greater than an apparent resistance value $R_0$ across the variable capacitor of said resonance circuit when said Q adjusting resistor is coupled in the circuit in order to attain the same resonance characteristic as if a physical resistor $R_0$ were coupled across the variable capacitor.

*9. A video signal play-back circuit comprising:*

*a magnetic head which detects a video signal recorded on a magnetic recording medium and produces an output signal representative of said video signal;*

*a resonance circuit which is electrically connected to receive the output signal of said magnetic head, and which includes an inductance element and a capacitance element including a variable capacitor for adjusting the resonance frequency of the resonance circuit for equalization of the frequency characteristic of the signal play-back circuit by compensating the frequency characteristic of the output signal of the magnetic head;*

*an amplifier circuit which amplifies a signal from said resonance circuit; and*

*means for adjusting a quality factor Q of said resonance circuit without any substantial increase in thermal noise of said resonance circuit, said means comprising*

*a variable resistor which is connected as a negative feedback resistor between one output terminal of said amplifier circuit and one terminal of said resonance circuit as a resistor for said resonance circuit which has a value of resistance which sets the quality factor Q of said resonance circuit at a value between 2 and 4.*

*10. A video signal play-back circuit comprising:*

*a rotating magnetic head which detects a video signal recorded on a magnetic recording medium and produces an output signal representative of said video signal;*

*a rotary transformer which derives a signal from the output signal of the rotating magnetic head;*

*a boosting transformer which boosts a signal from said rotary transformer;*

*a resonance circuit which is electrically connected to said boosting transformer in order to improve a frequency characteristic of an output signal of said boosting transformer to thereby compensate the frequency characteristics of the output signal of the magnetic head, wherein said resonance circuit includes an inductance element and a capacitance element including a variable capacitor for adjusting the resonance frequency of the resonance circuit for equalization of the frequency characteristic of the signal play-back circuit by the compensation of the magnetic head output signal frequency characteristic;*

*an amplifier circuit which amplifies a signal from said resonance circuit; and*

*means for adjusting a quality factor Q of said resonance circuit without any substantial increase in thermal noise of said resonance circuit, said means comprising*

*a variable resistor which is connected as a negative feedback resistor between one output terminal of said amplifier circuit and one terminal of said resonance circuit as a resistor for the resonance circuit which has a value of resistance which sets the quality factor Q of said resonance circuit at a value between 2 and 4.*

*11. A video signal play-back circuit comprising:*

*a rotating magnetic head which detects a video signal recorded on a magnetic recording medium and produces an output signal representative of said video signal;*

*a rotary transformer which derives a signal from the rotating magnetic head;*

*a boosting transformer coupled to a secondary coil of said rotary transformer to boost a signal from said rotary transformer;*

*a resonance circuit which is electrically connected to said boosting transformer in order to improve a frequency characteristic of an output signal of said boosting transformer to thereby compensate the frequency characteristics of the output signal of the magnetic head, wherein said resonance circuit includes an inductance element and a capacitance element including a variable capacitor coupled across a secondary coil of said boosting transformer for adjusting the resonance frequency of the resonance circuit for equalization of the frequency characteristic of the signal play-back circuit by the compensation of the magnetic head output signal frequency characteristic;*

*an amplifier circuit which amplifies a signal from said resonance circuit; and*

*means for adjusting a quality factor Q of said resonance circuit without any substantial increase in thermal noise of said resonance circuit, said means comprising*

*a variable resistor which is connected as a negative feedback resistor between one output terminal of said amplifier circuit and one terminal of said resonance circuit as a resistor for the resonance circuit which has a value of resistance which sets the quality factor Q of said resonance circuit at a value between 2 and 4, wherein the Q adjusting resistor has a resistance value $R_1$ which is greater than an apparent resistance value $R_0$ across the variable capacitor of said resonance circuit when said Q adjusting resistor is coupled in the circuit in order to attain the same resonance characteristic as if a physical resistor $R_0$ were coupled across the variable capacitor.*

*12. A video signal play-back circuit comprising:*

*a magnetic head which detects a frequency modulated video signal having a predetermined carrier frequency and recorded on a magnetic recording medium;*

*a resonance circuit which is electrically connected to said magnetic head so that the signal picked up by said magnetic head may be applied to said resonance circuit, and which includes an inductance element and a capacitance element including a variable capacitor for adjusting the resonance frequency of the resonance circuit for equalization of the frequency characteristic of the output signal of said magnetic head, the resonance frequency of said resonance circuit being equal to or higher than said carrier frequency;*

*an amplifier circuit amplifying an output signal of said resonance circuit; and*

*means for adjusting a quality factor Q of said resonance circuit without any substantial increase in thermal noise of said resonance circuit, said means comprising*

*a variable resistor which is connected between one output terminal of said amplifier circuit and one terminal of said resonance circuit and which has a value of resistance which sets the quality factor Q of said resonance circuit at a value between 2 and 4.*

*13. A video signal play-back circuit comprising:*

*a rotating magnetic head which detects a frequency modulated video signal having a predetermined carrier frequency and recorded on a magnetic recording medium;*

*a rotary transformer which derives a signal from the rotating magnetic head;*

*a boosting transformer which boosts a signal from said rotary transformer;*

*a resonance circuit which is electrically connected to said boosting transformer in order to improve a frequency characteristic of an output signal of said boosting transformer and which includes an inductance element and a capacitance element including a variable capacitor for adjusting the resonance frequency of the*

*resonance circuit for equalization of the frequency characteristic of the output signal of said boosting transformer, the resonance frequency of said resonance circuit being equal to or higher than said carrier frequency;*

*an amplifier circuit amplifying an output signal of said resonance circuit; and*

*means for adjusting a quality factor Q of said resonance circuit without any substantial increase in thermal noise of said resonance circuit, said means comprising*

*a variable resistor which is connected between one output terminal of said amplifier circuit and one terminal of said resonance circuit and which has a value of resistance which sets the quality factor Q of said resonance circuit at a value between 2 and 4.*

*14. A video signal play-back circuit comprising:*

*a rotating magnetic head which detects a frequency modulated video signal having a predetermined carrier frequency and recorded on a magnetic recording medium;*

*a rotary transformer which derives a signal from the rotating magnetic head;*

*a boosting transformer coupled to a secondary coil of said rotary transformer to boost a signal from said rotary transformer;*

*a resonance circuit which is electrically connected to said boosting transformer in order to improve a frequency characteristic of an output signal of said boosting transformer, and which includes an inductance element and a capacitance element including a variable capacitor coupled across a secondary coil of said boosting transformer for adjusting the resonance frequency of the resonance circuit for equalization of the frequency characteristic of the output signal of said boosting transformer, the resonance frequency of said resonance circuit being equal to or higher than said carrier frequency;*

*an amplifier circuit amplifying an output signal of said resonance circuit; and*

*means for adjusting a quality factor Q of said resonance circuit without any substantial increase in thermal noise of said resonance circuit, said means comprising*

*a variable resistor which is connected between one output terminal of said amplifier circuit and one terminal of said resonance circuit and which has a value of resistance which sets the quality factor Q of said resonance circuit at a value between 2 and 4, wherein the Q adjusting resistor has a resistance value $R_1$ which is greater than an apparent resistance value $R_0$ across the variable capacitor of said resonance circuit when said Q adjusting resistor is coupled in the circuit in order to attain the same resonance characteristic as if a physical resistor $R_0$ were coupled across the variable capacitor.*

* * * * *